United States Patent [19]

Kim et al.

[11] Patent Number: 5,227,621
[45] Date of Patent: Jul. 13, 1993

[54] ULTRA-WIDEBAND HIGH POWER PHOTON TRIGGERED FREQUENCY INDEPENDENT RADIATOR

[75] Inventors: Anderson H. Kim, Toms River; Leo D. Didomenico, Spotswood; Maurice Weiner, Ocean, all of N.J.; Louis J. Jasper, Jr., Fulton, Md.; Robert J. Youmans, Brick; Thomas E. Koscica, Clark, both of N.J.

[73] Assignee: The United States of America as represented by the Secretary of the Army, Washington, D.C.

[21] Appl. No.: 946,718

[22] Filed: Sep. 18, 1992

[51] Int. Cl.$^5$ .............................................. H01J 40/14
[52] U.S. Cl. .................... 250/214.1; 257/459
[58] Field of Search .............. 250/214.1; 357/457, 357/444, 448, 459

[56] References Cited

U.S. PATENT DOCUMENTS 5,177,486 1/1993 Kim et al. ..................... 250/214.1

Primary Examiner—David C. Nelms
Attorney, Agent, or Firm—Michael Zelenka; William H. Anderson

[57] ABSTRACT

A photoconductive switch coupled to an energy storage device wherein the switch is comprised of photoconductive semiconductor material while the energy storage device comprises two quasi-radial transmission line including a different material, i.e. a dielectric storage medium. The photoconductive semiconductor gallium arsenide switch is electrically connected to two quasi-radial transmission lines formed in part by layers of metallization configured in a quasi-radially shaped pattern upon the energy storage device. A variation comprises a photoconductive semiconductor gallium arsenide wafer sandwiched between two quasi-radial transmission lines so that the semiconductor gallium arsenide wafer serves as substrate, energy storage medium, and photoconductive switch.

12 Claims, 4 Drawing Sheets

FIG. 3a
FIG. 3c
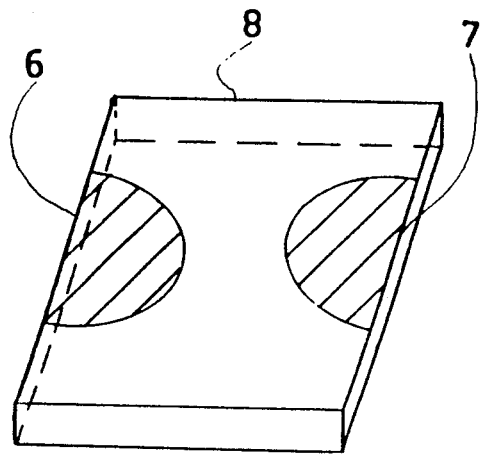
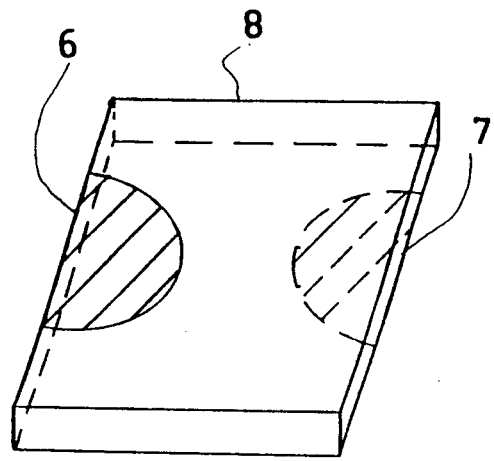
FIG. 3b
FIG. 3d
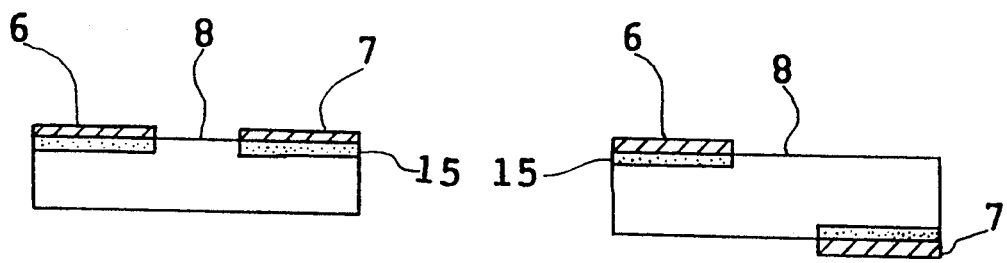

ULTRA-WIDEBAND HIGH POWER PHOTON TRIGGERED FREQUENCY INDEPENDENT RADIATOR

GOVERNMENT INTEREST

The invention described herein may be manufactured, used, and licensed by or for the Government of the United States of America for governmental purposes without the payment to us of any royalty thereon.

FIELD OF THE INVENTION

This invention relates generally to electrical pulse signal generators and more particularly to a nanosecond, kilovolt pulse generator for use in impulse radar apparatus, active electromagnetic signal jammers, and relatively high power microwave weapon systems.

BACKGROUND OF THE INVENTION

In recent years there has been active research in the area of generation of nanosecond type pulses utilizing a high power photoconductive solid state switch coupled to a storage device. In such systems, the photoconductive switch must exhibit a transition from a high resistivity state to a conductive state in a sub-nanosecond time interval. One such switch is disclosed in U.S. Pat. No. 5,028,971 issued to Anderson H. Kim et al on Jul. 2, 1991, and entitled, "High Power Photoconductor Bulk GaAs Switch" which is incorporated herein by reference. This patent discloses a photoconductive gallium arsenide (GaAs) switch having two mutually opposite gridded electrodes which receive activating light from a laser. When the laser light is applied to the switch, the electrical resistance of the semiconductive material is decreased through electron/hole pairs being generated. This resistance change is translated into a change in the current that flows through an output circuit. The other critical element in the generation of fast electrical pulses is the energy storage element. Depending on the desired structure, the energy storage element should not only produce sub-nanosecond pulsewidths, but also should provide voltage enhancement.

Heretofore, two general techniques have been used to generate and deliver fast rise time, high power pulses to a load impedance. The first technique utilizes the recombination property of the semiconductor material from which the switch itself is fabricated. The pulses generated with this technique using photoconductive GaAs switches typically have a long pulsewidth with a relatively long recovery time at high bias voltage. This long recovery time has been attributed to the substantially long recombination time and the switch lock-on phenomenon exhibited by gallium arsenide. The second technique controls the output pulsewidth by an energy storage element which comprises either a short section of transmission line or capacitor. This energy storage element is utilized to deliver all or substantially most of the stored energy to the impedance load so that only a closing photoconductive switch is required. Neither of these techniques, however, produce an ideal subnanosecond pulsewidth because of the extended recovery time inherent in most photoconductive switches.

SUMMARY OF THE INVENTION

Accordingly, the first general purpose of this invention is to provide an improved high power, ultra-wide band frequency radiator capable of generating and radiating high amplitude pulses with a range of frequency components from hundreds of megahertz to several gigahertz.

Another object of this invention is to combine into one structure the functions of energy and antenna, thereby increasing compactness and efficiency.

A still further object of this invention is to provide a high power, ultra-wide band frequency radiator that is simple and relatively inexpensive to manufacture, and possesses reduced size and weight. Other objects of the present invention include minimizing wave dispersion, wave reflection at interfaces, and insertion loss, thereby increasing overall efficiency.

The foregoing and other objects of this invention are achieved by the combination of a photoconductive switch coupled to a unique energy storage and radiation device. In one preferred embodiment, the energy storage device includes a dielectric storage medium, two quasi-radially shaped, metallized electrodes mounted opposite one another on a top surface of the dielectric storage medium and a metallized electrode mounted on a bottom surface of the dielectric medium. The photoconductive switch is centrally mounted on the dielectric between the two quasi-radially shaped electrodes such that the switch connects the two quasi-radially shaped electrodes.

In operation, the two quasi-radially shaped electrodes are electrically biased, while the bottom electrode is grounded. Due to the biasing of the electrodes, energy is stored in the dielectric while the photoconductive switch is in the off-state. When the photoconductive semiconductor switch is in the on-state, however, the stored electrostatic energy in the energy storage device propagates as a time varying electromagnetic wave and is ultimately radiated from the two quasi-radially shaped electrodes into open space.

As may be readily appreciated by those skilled in the art, the shape of the two quasi-radially shaped electrodes will have a great effect on the size of the energy storing capacitance, bandwidth of the radiated frequency spectrum, radiation efficiency, directivity, radiation resistance, and field polarization diversity. Therefore and as may also be appreciated by those skilled in the art, the combination of the high voltage capability of the photoconductive switch and the inherent voltage gain of the quasi-radially shaped electrodes will enable the present invention to produce high power, wide frequency spectrum RF signals.

The concept of the present invention is extended in another embodiment of the invention by utilization of a semi-insulating GaAs wafer to fill the role of the dielectric material and optically activated switch. The result is an extremely compact ultra-wideband RF generator, which combines the functions of energy storage, switching, energy transmission, and radiation into a single device formed on a semi-insulating GaAs wafer substrate. The resultant multi-frequency high peak power RF radiator will generate and radiate high amplitude signals with a range of frequency components from hundreds of megahertz to several gigahertz.

In this embodiment, two quasi-radial transmission line structures are formed directly over highly doped regions (n-type or p-type doped layers) on a top surface of a GaAs substrate. A grounded electrode is formed on a bottom surface of the GaAs substrate. Because GaAs becomes conductive when exposed to laser light, the GaAs wafer in combination with the two quasi-radial transmission lines on the top surface act as a photoconductive switch. The resultant structure also creates a GaAs capacitor due to the sandwiching of the GaAs wafer (dielectric constant $\epsilon r=2.7$) between two sets of upper and lower metallized electrodes.

In operation, electrostatic energy is stored in the GaAs wafer due to the biasing of the electrodes. Once laser light is introduced to the center portion of the GaAs wafer, current flows in opposite directions across a shallow portion of the GaAs wafer where the laser light is introduced. Thus, a time varying electromagnetic wave is generated by the transient electric field between quasi-radial transmission lines and then this electromagnetic energy is radiated into the open space via the transmission lines.

A system related to the present invention may be found in U.S. patent application Ser. No. 07/797,595 entitled "Optically Activated Sub-Nanosecond Hybrid Pulser", by Kim et al, filed on Nov. 25, 1991, which is incorporated herein by reference hereto. This patent application discloses the combination of a photoconductive switch coupled to an energy storage device wherein the switch is comprised of photoconductive semiconductor material, while the energy storage device comprises a nonlinear radial transmission line including a different material, i.e., a dielectric storage medium. By triggering a pulser in accordance with the device disclosed in U.S. patent application Ser. No. 07/797,595 with fast risetime laser light, a high amplitude pulse of sub-nanosecond pulsewidth would be produced.

The present invention, however, improves upon the pulser disclosed in U.S. patent application Ser. No. 07/797,595 by modifying, in one embodiment, the electrode shape so as to result in a device capable of more efficiently radiating a RF impulse waveform.

BRIEF DESCRIPTION OF THE DRAWINGS

Other objects and many of the attendant advantages of this invention will be readily appreciated as the same becomes better understood by reference to the following detailed description when considered in connection with the accompanying drawings in which like reference numerals designate like parts throughout the figures thereof.

FIG. 1b is a side schematic view of the dielectric medium (hybrid) embodiment of the invention along section line 1a.

FIG. 3a and FIG. 3c are top views of the alternate embodiments of the photoconductive GaAs discrete switch.

FIG. 3b and FIG. 3d are side schematic diagrams of the alternate embodiments of the photoconductive GaAs discrete switch along section lines 3a—3a and 3c—3c respectively.

FIG. 4b is a side view schematic view of the monolithic GaAs wafer device along section line 4a—4a.

DETAILED DESCRIPTION OF THE INVENTION

Figure 1A:
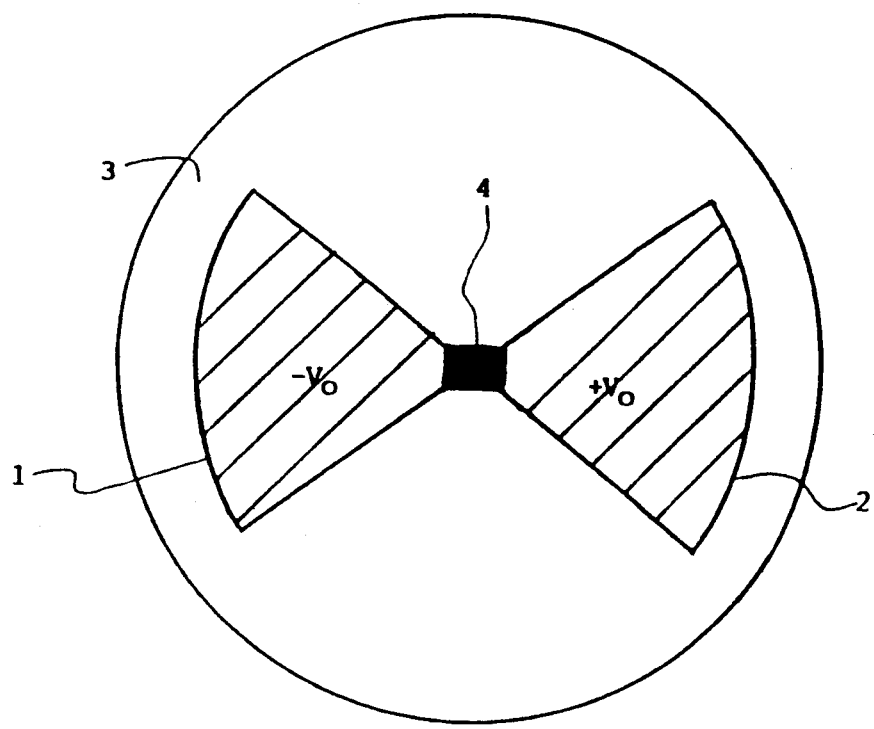
FIG. 1a is a top pictorial view of the dielectric medium (hybrid) embodiment of the invention.
Figure 1B:
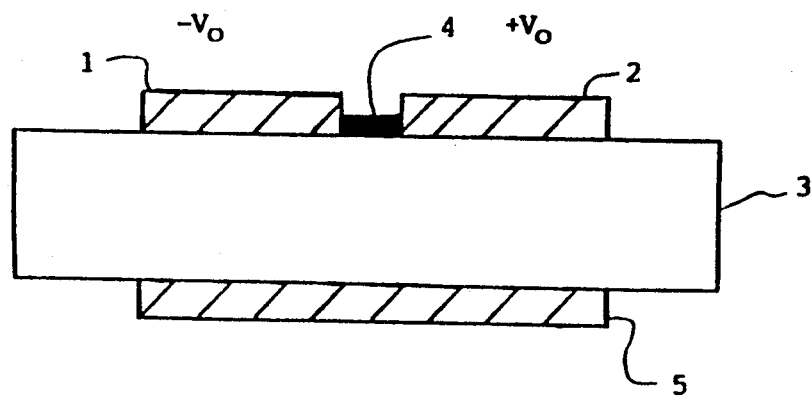

Referring now to the drawings there is shown in FIG. 1a a top pictorial view of the hybrid embodiment of the present invention. As shown, first and second quasi-radially shaped electrodes 1 and 2 are formed on a top surface 50 of circular dielectric medium 3. The dielectric medium serves as a substrate plate wherein energy is stored when electrodes 1 and 2 are electrically biased. Photoconductive switch 4 is placed between the quasi-radially electrodes and 2 such that switch 4 connects the inner edges of the first and second electrodes 1 and 2. As shown in FIG. 1b, the dielectric medium 3 is, in turn, affixed to circular metallized electrode plate 5 which is grounded.

Figure 2A:
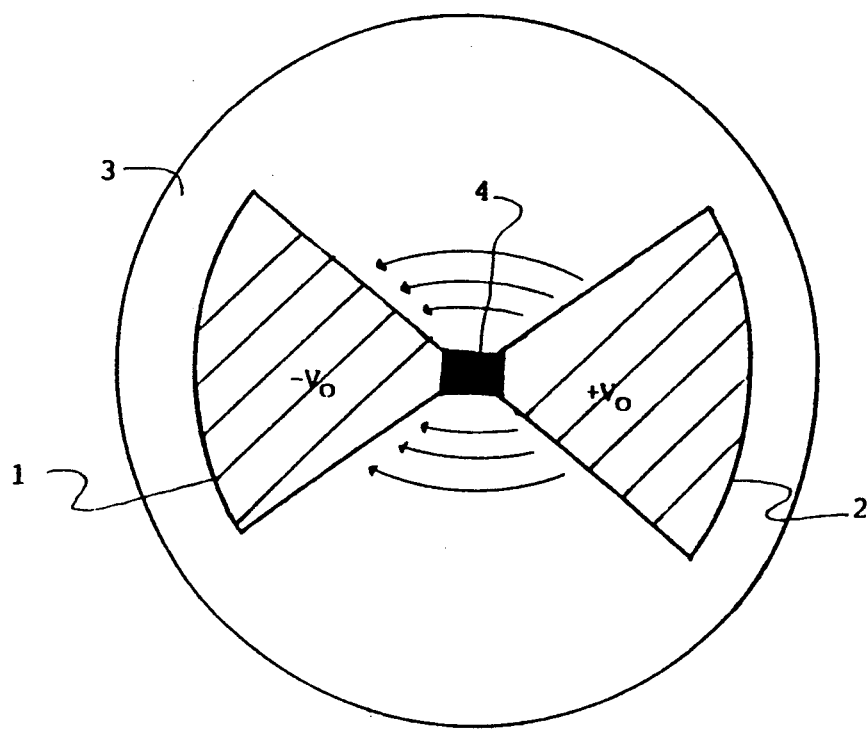
FIG. 2a is a top view of the electric field line during the operating sequence of the hybrid embodiment.
Figure 2B:
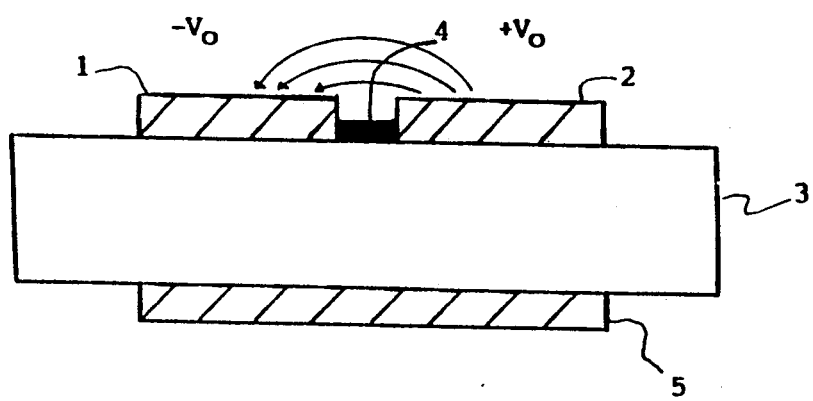
FIG. 2b is a side schematic diagram of the electric field line during the operating sequence of the hybrid embodiment.

FIG. 2a depicts the operation of the present invention. Initially, electrodes 1 and 2 are electrically biased by negative and positive pulse bias voltages, $-Vo$ and $+Vo$, respectively, which are delivered by means of electrical connections (not shown). When the photoconductive semiconductor switch 4 is exposed to laser light pulses, the stored electrostatic energy in the quasi-radial transmission line structures start to flow in opposite directions through the photoconductive switch from high voltage potential to low voltage potential, thereby generating a time varying electromagnetic wave. This energy is then radiated into open space via electrodes 1 and 2. FIG. 2b depicts a side schematic view of the hybrid embodiment of the invention showing this charge flow.

The photoconductive switch 4, utilized in this embodiment of the invention, may be any photoconductive switch such as the switch with oppositely mounted electrodes taught in U.S. Pat. No. 5,028,971 or the switch may be configured like that shown in FIGS. 3a-d. The alternate embodiments of switch 4, shown in FIGS. 3a-d, comprise a semiconductor substrate 8 and two metallized electrodes 6 and 7 which are designed to make electrical contact with the inner edges of the electrodes 1 and 2. The difference between these embodiments are, of course, that the electrodes may be mounted on the same surface of the substrate 8, as shown in FIGS. 3a and 3b, or they may be mounted on opposing sides and opposing surfaces of the substrate 8, as shown in FIGS. 3c and 3d. The region 15 beneath the metal electrodes may be a doped layer (either n or p) so as to provide for an improved ohmic contact for the electrodes 9 and 10.

As may be readily appreciated by those skilled in the art, the shape of electrodes 1 and 2 of the quasi-radial transmission line structures will have a great effect on the size of the energy storing capacitance, bandwidth of the radiated frequency spectrum, radiation efficiency, directivity, radiation resistance, and field polarization diversity. In the exemplary embodiment, the electrodes 1 and 2 are quasi-radially shaped.

As has been described, the functions of the energy storage and antenna are combined into a single structure. The combination of the functions of the elements found in the present invention eliminate a loss associated with the coupling and delivery of the energy through a waveguide. Hence, this new device will be more compact and more efficient than devices previously disclosed.

Figure 4A:
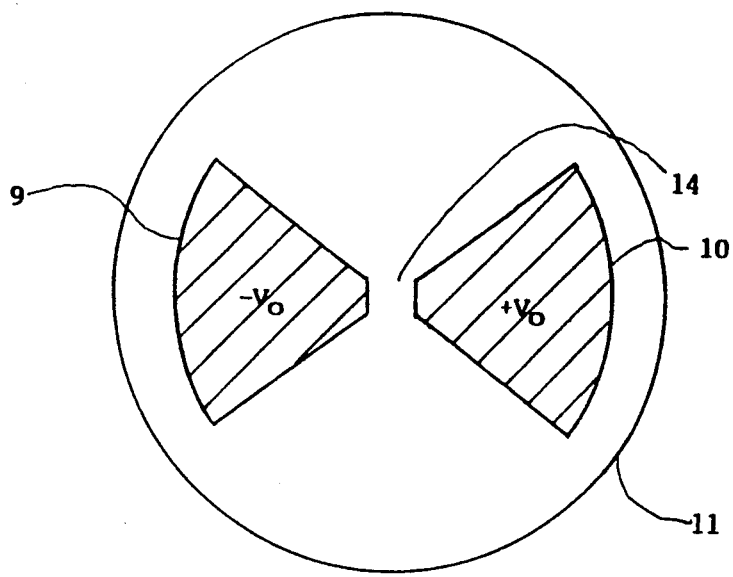
FIG. 4a is a top pictorial view of the monolithic GaAs wafer embodiment of the invention.
Figure 4B:
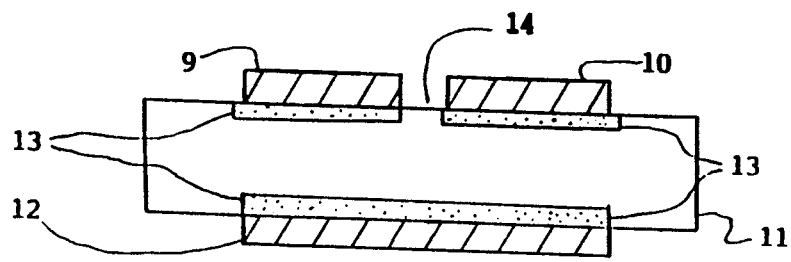

FIG. 4a and 4b show an alternate embodiment of the present invention, namely, a monolithic high power ultra-wideband radiator. As shown, electrodes 9 and 10 are connected to an upper surface of semi-insulating GaAs wafer 11. Electrodes 9 and 10 are quasi-radially shaped and serve as quasi-radial transmission line structures. The opposite surface of semi-insulating GaAs wafer 11 is, in turn, connected to a circular metallized electrode plate 12 which is grounded. The semi-insulating GaAs wafer 11 serves as the substrate material for energy storage as well as acts as the photoconductive material replacing the need for switch 4 described above. The diameter of the GaAs wafer 11 would typically be 7.5 cm in diameter and have a dielectric constant of $\epsilon r = 12.7$. The region 13 of the GaAs wafer 11 directly beneath electrodes 9 and 10 is preferably highly doped to provide an improved ohmic contact for electrodes 9 and 10. Therefore, ground electrode 12 and electrodes 9 and 10 being mounted on the GaAs wafer form a capacitor. Moreover, because the GaAs wafer will become conductive when exposed to laser light, this structure will act as a photoconductive switch.

Accordingly in operation, electrostatic energy is stored the GaAs wafer 11 when electrodes 9 and 10 are electrically biased by the pulse bias voltages, $+Vo$ and $-Vo$, as shown in FIG. 4a. This is accomplished by means of electrical connections which are not shown. These opposite bias voltages produce the necessary potential differences on the two quasi-radial transmission lines. When laser light is introduced to the GaAs substrate between electrodes 9 and 10, the GaAs substrate becomes conductive in a shallow region between electrodes 9 and 10. Preferably, the switching actions only occurs in the center of the invention, where the optical energy is introduced. This switching action induces the electrostatic energy stored in the device to flow in opposite directions across the shallow region, thereby generating traveling waves that flow in a direction from higher voltage potential to lower voltage potential This energy, then, is radiated into space via electrodes 9 and 10. Thus, during this discharge cycle, the quasi-radial structures on the GaAs wafer 11 act as an ultra-wideband antenna which radiates electromagnetic energy signals perpendicular to their upper surfaces. Hence, a time varying electromagnetic wave is generated by this transient electric field with a frequency spectrum in the range of tens of megahertz to several gigahertz.

Having thus shown and described what is at present considered to be the preferred embodiments of the invention, it should be noted that the same has been made by way of illustration and not limitation. Accordingly, all modifications, alterations and changes coming within the spirit and scope of the invention as set forth in the appended claims are herein meant to be included.

What is claimed is:

1. An ultra-wide band RF radiator, comprising:
   an electrical energy storage device coupled to a source of electrical voltage comprised of a circular dielectric medium having an upper and lower surface, said lower surface of said dielectric medium resting on a metallized circular electrode plate, and a metallized first upper electrode resting on said upper surface of said dielectric medium thereby forming a first quasi-radial electrical transmission line;
   a metallized second upper electrode resting on said upper surface of said dielectric medium thereby forming a second quasi-radial electrical transmission line; and
   a photoconductive switch electrically connected to said first and second upper electrodes, said switch becoming conductive upon the application of predetermined type of light energy to cause a time-varying electromagnetic wave to be generated between said first and second quasi-radial transmission lines thereby generating a relatively high amplitude, narrow output pulse of nanosecond pulsewidth dimensions.

2. The ultra-wide band RF radiator according to claim 1 wherein said first and second upper electrodes comprise quasi-radially shaped patterns of metallization.

3. The ultra-wide band RF radiator according to claim 2 wherein said first and second upper metallized electrodes are given opposite bias charges.

4. The ultra-wide band RF radiator according to claim 3 wherein said photoconductive switch is centrally located upon said upper surface of said dielectric medium between said first and a second quasi-radial transmission lines.

5. The ultra-wide band RF radiator according to claim 4 wherein said metallized circular electrode plate is grounded.

6. An ultra-wide band RF radiator, comprising:
   an photoconductive, semi-insulating wafer electrical energy storage element, said semi-insulating wafer having a first and second major surface;
   a metallized circular electrode plate affixed to said second major surface of said photoconductive, semi-insulating wafer;
   a metallized first upper electrode resting on said first major surface of said photoconductive, semi-insulating wafer thereby forming a first quasi-radial electrical transmission line;
   a metallized second upper electrode resting on said first major surface of said photoconductive, semi-insulating wafer thereby forming a second quasi-radial electrical transmission line;
   a photoconductive switching means for exposing the region of said photoconductive, semi-insulating wafer electrical energy storage element located between said first and second upper electrodes to light energy, said photoconductive, semi-insulating wafer becoming conductive upon the application of predetermined type of light energy to cause a relatively high amplitude, narrow output pulse of a nanosecond pulsewidth dimensions to be thereby generated.

7. The ultra-wide band RF radiator of claim 6 wherein the regions of said photoconductive, semi-insulating wafer directly adjacent said first and second upper electrodes and said metallized circular electrode are highly doped.

8. The ultra-wide band RF radiator of claim 7 wherein said photoconductive, semi-insulating wafer is comprised of GaAs and said photoconductive, semi-insulating wafer serves as said switching means.

9. The ultra-wide band RF radiator according to claim 8 wherein said first and second upper electrodes comprise quasi-radially shaped patterns of metallization.

10. The ultra-wide band RF radiator according to claim 9 wherein said first and second upper metallized electrodes are given opposite bias charges.

11. The ultra-wide band RF radiator according to claim 10 wherein said switching means is centrally located between said first and a second quasi-radial transmission lines.

12. The ultra-wide band RF radiator according to claim 11 wherein said metallized circular electrode plate is grounded.

* * * * *